US010517166B2

(12) United States Patent
Matsui

(10) Patent No.: US 10,517,166 B2
(45) Date of Patent: Dec. 24, 2019

(54) OPTICAL TRANSCEIVER INCLUDING HEAT DISSIPATION STRUCTURE

(71) Applicant: SUMITOMO ELECTRIC INDUSTRIES, LTD., Osaka-shi (JP)

(72) Inventor: Takashi Matsui, Osaka (JP)

(73) Assignee: Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 16/294,633

(22) Filed: Mar. 6, 2019

(65) Prior Publication Data
US 2019/0281691 A1 Sep. 12, 2019

(30) Foreign Application Priority Data
Mar. 6, 2018 (JP) .................. 2018-039624

(51) Int. Cl.
H05K 1/02 (2006.01)
G02B 6/42 (2006.01)
H05K 1/14 (2006.01)
H04B 10/40 (2013.01)
H05K 1/18 (2006.01)

(52) U.S. Cl.
CPC ........... *H05K 1/0203* (2013.01); *G02B 6/428* (2013.01); *G02B 6/4268* (2013.01); *G02B 6/4272* (2013.01); *H04B 10/40* (2013.01); *H05K 1/144* (2013.01); *H05K 1/181* (2013.01); *G02B 6/4246* (2013.01); *H05K 2201/042* (2013.01); *H05K 2201/10121* (2013.01); *H05K 2201/10189* (2013.01)

(58) Field of Classification Search
CPC .................. G02B 6/4268–4269; H05K 1/0203
See application file for complete search history.

(56) References Cited

U.S. PATENT DOCUMENTS 5,561,590 A * 10/1996 Norell ................. H01L 23/3733
165/185
5,831,831 A * 11/1998 Freeland ............. H01L 23/4275
361/704
6,094,349 A * 7/2000 Fassel .................... H05K 3/284
165/80.2

(Continued)

FOREIGN PATENT DOCUMENTS

JP 2006-269505 A 10/2006
JP 2006-313768 A 11/2006
JP 2009-026871 A 2/2009

Primary Examiner — Robert J Hoffberg
(74) Attorney, Agent, or Firm — Baker Botts L.L.P.; Michael A. Sartori

(57) ABSTRACT

An optical transceiver according to one example comprises: a housing having an inner surface therein; a first printed circuit board on which a CDR, which generates heat by consuming electric power, is mounted; a second printed circuit board arranged between the inner surface and the first printed circuit board; a protection member arranged to surround the periphery of the CDR in parallel with the inner surface; a thermal conductive gel in contact with each of the CDR, the protection member and the second printed circuit board; a heat dissipation sheet arranged between the second printed circuit board and the inner surface; and a heat dissipation sheet arranged between the first printed circuit board and the inner surface, wherein the protection member has an opening in contact with a part of the thermal conductive gel.

6 Claims, 11 Drawing Sheets

(56) References Cited

U.S. PATENT DOCUMENTS

| | | | | |
|---|---|---|---|---|
| 7,006,353 B2* | 2/2006 | Matteson | ............... | H01L 23/42 |
| | | | | 165/185 |
| 9,250,027 B2* | 2/2016 | Hsieh | ................... | H05K 1/0209 |
| 9,671,583 B2* | 6/2017 | Matsui | ................ | G02B 6/4261 |
| 2019/0195577 A1* | 6/2019 | Kim | ....................... | H01L 23/42 |

* cited by examiner

OPTICAL TRANSCEIVER INCLUDING HEAT DISSIPATION STRUCTURE

CROSS REFERENCE TO RELATED APPLICATIONS

The present application claims benefit of Japanese Priority Application of JP2018-039624 filed on Mar. 6, 2018, which is incorporated herein as reference.

TECHNICAL FIELD

One aspect of the present invention relates to an optical transceiver including a heat dissipation structure.

BACKGROUND

Japanese Unexamined Patent Publication No. 2006-269505 describes a cooling structure using a cooling module to cool an LSI (Large Scale Integration) attached to a substrate. The cooling structure comprises: a sealing member for sealing the LSI on an upper surface of the substrate on which the LSI is mounted; a thermal conductive gel filled in the sealing member; and the cooling module for cooling the sealing member and the thermal conductive gel. The cooling module has a gel inlet for introducing the thermal conductive gel into the sealing member. After introducing the thermal conductive gel, a pressurizing member is inserted into the gel inlet. The thermal conductive gel is pressurized by the pressurizing member, and spreads in the sealed space around the LSI. Thus, the thermal conductive gel spreads around the LSI and adheres to the surface of the LSI, thereby exhibiting the cooling effect.

Japanese Unexamined Patent Publication No. 2006-313768 describes a cooling structure for cooling a driving device which drives an injector for injecting fuel to an engine of a vehicle. This cooling structure comprises: a heat radiation plate having a circuit board on which a heat generating device is mounted; a case fixed on the heat radiation plate and sealing the heat generating device and the circuit board; and a gel-like filling agent filled in the case. The case is provided with a heat absorbing part projecting downward toward the heat generating device. Heat generated from the heat generating device is released to the outside through the gel-like filling agent and the heat absorbing part.

Japanese Unexamined Patent Publication No. 2009-26871 describes a manufacturing method of an electronic device. In this manufacturing method, a thermal conductive silicone gel is applied to the surface of an IC chip, and a circuit board on which the IC chip is mounted is stored inside a housing body. Then, a heat sink is inserted from an opening formed on the housing body. The heat sink is mounted on the thermal conductive silicone gel. Thus, the thermal conductive silicone gel is applied to the surface of the IC chip, and the heat sink is mounted on the thermal conductive silicone gel. Consequently, a heat dissipation path for the IC chip is secured.

SUMMARY

An optical transceiver according to one aspect of the present invention comprises: a housing having a first surface and a second surface facing to the first surface, an internal space between the first surface and second surface therein; a first printed circuit board arranged between the first surface and the second surface in the internal space; a heat generating component mounted on the first printed circuit board, the heat generating component generating heat by consuming electric power; a second printed circuit board arranged between the first surface and the first printed circuit board in the internal space; a protection member arranged between the first printed circuit board and the second printed circuit board and also arranged to surround the periphery of the heat generating component in parallel with the first printed circuit board and the second printed circuit board; a thermal conductive gel arranged between the first printed circuit board and the second printed circuit board to be contact with each of at least the heat generating component, the protection member and the second printed circuit board; a first heat dissipation sheet arranged between the second printed circuit board and the first surface in the internal space; and a second heat dissipation sheet arranged between the first printed circuit board and the second surface in the internal space, wherein the protection member surrounds the thermal conductive gel and has an opening in contact with a part of the thermal conductive gel.

DETAILED DESCRIPTION

Figure 1:
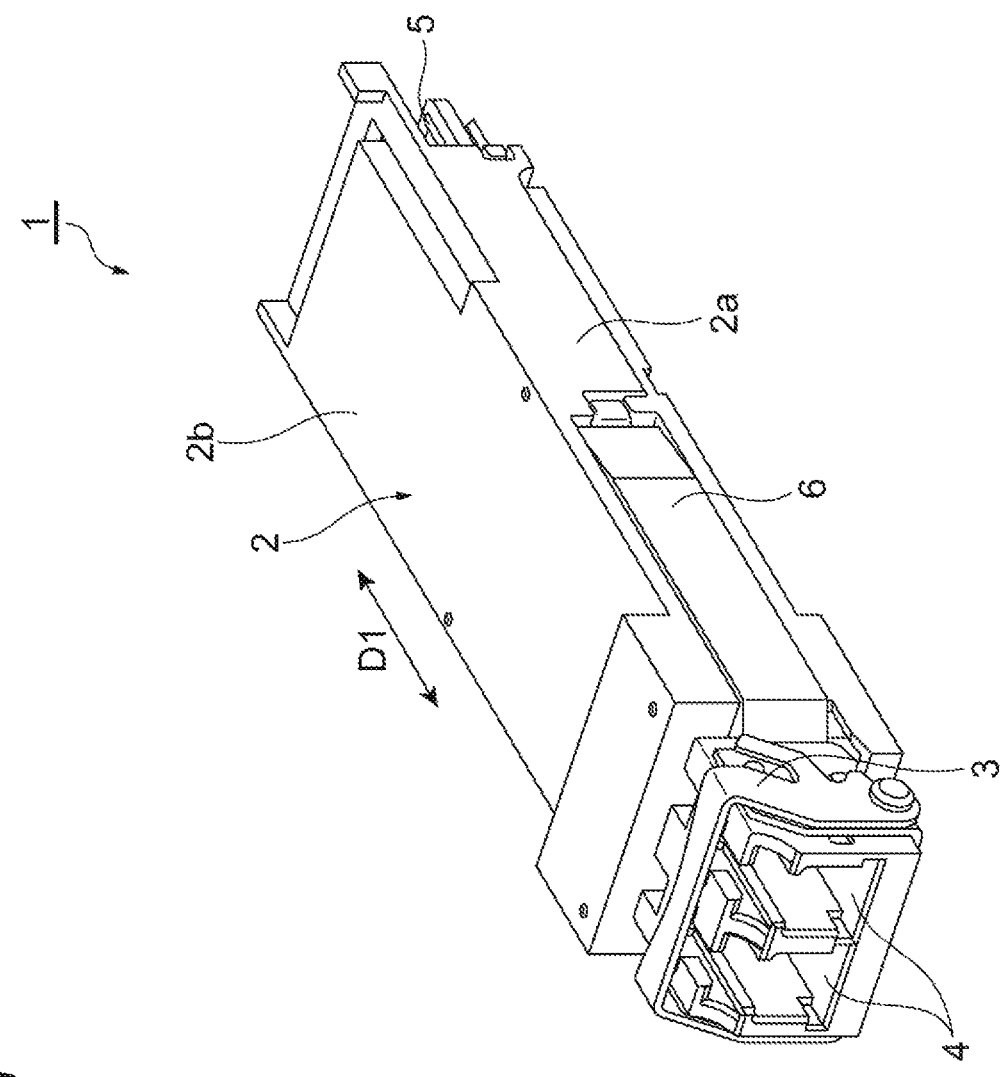
FIG. 1 is a perspective view showing an optical transceiver according to a first embodiment of the present invention.

Specific examples of an optical transceiver according to an embodiment of the present invention will be described below with reference to the drawings. It should be noted that the present invention is not limited to the following examples, but is indicated by the scope of the claims and is intended to include all changes within the scope equivalent to the scope of the claims. In the following description, the components which are the same as or equivalent to those in the description of the drawings are denoted by the same reference numerals, and the explanation thereof will be appropriately omitted as redundant.

First Embodiment

FIG. 1 is a perspective view showing an optical transceiver 1 according to a first embodiment. The optical transceiver 1 conforms to, for example, the SFP (small form-factor pluggable) standard and performs full-duplex bidirectional optical communication. The optical transceiver 1 is inserted into and removed from (inserted into and pulled out of) a cage provided in a host system (electrical apparatus), along a direction D1 that is the longitudinal direction of the optical transceiver 1. The optical transceiver 1 comprises a housing 2, and a veil 3. The housing 2 has a rectangular parallelepiped shape extending along the direction D1. The housing 2 is made of metal. The cross-sectional shape of the housing 2 perpendicular to the direction D1 is, for example, a rectangular shape. The housing 2 has a pair of side surfaces 2a extending in the direction D1, an upper surface 2b, and a bottom surface 2c (see FIG. 2). The upper surface 2b and the bottom surface 2c are perpendicular to the side surfaces 2a.

The housing 2 comprises a pair of optical receptacles 4 to be engaged with optical connectors provided at the tip of paired optical fiber cables. The optical receptacles 4 are provided at one end of the housing 2 in the direction D1. The housing 2 further comprises, at the other end in the direction D1, an electrical plug 5 to be connected to an electrical connector provided inside the cage of the host system. In the following description, occasionally, the one-end side (the optical receptacle 4 side) of the housing 2 is referred to as the front side, and the other-end side (the electrical plug 5 side) of the housing 2 is referred to as the rear side.

The optical transceiver 1 comprises an engagement mechanism for the cage of the host system. The engagement mechanism includes the veil 3 and sliders 6. One slider 6 is provided for each of the side surfaces 2a. The two sliders 6 constitute one pair of components. The veil 3 is rotatably attached to the sliders 6 above and in front of the optical receptacles 4. When the housing 2 is inserted into the cage (not shown) along the direction D1, the electrical plug 5 is fitted with an electrical connector (not shown) and the sliders 6 linearly move to the rear side, and then the optical transceiver 1 is engaged with the cage. The engagement can prevent the optical transceiver 1 from being accidentally pulled out of the cage. When the veil 3 is rotated to the front side and the lower side, the sliders 6 linearly move to the front side. The linear movement of the sliders 6 toward the front side allows the engagement of the optical transceiver 1 with the cage to be released.

Figure 2:
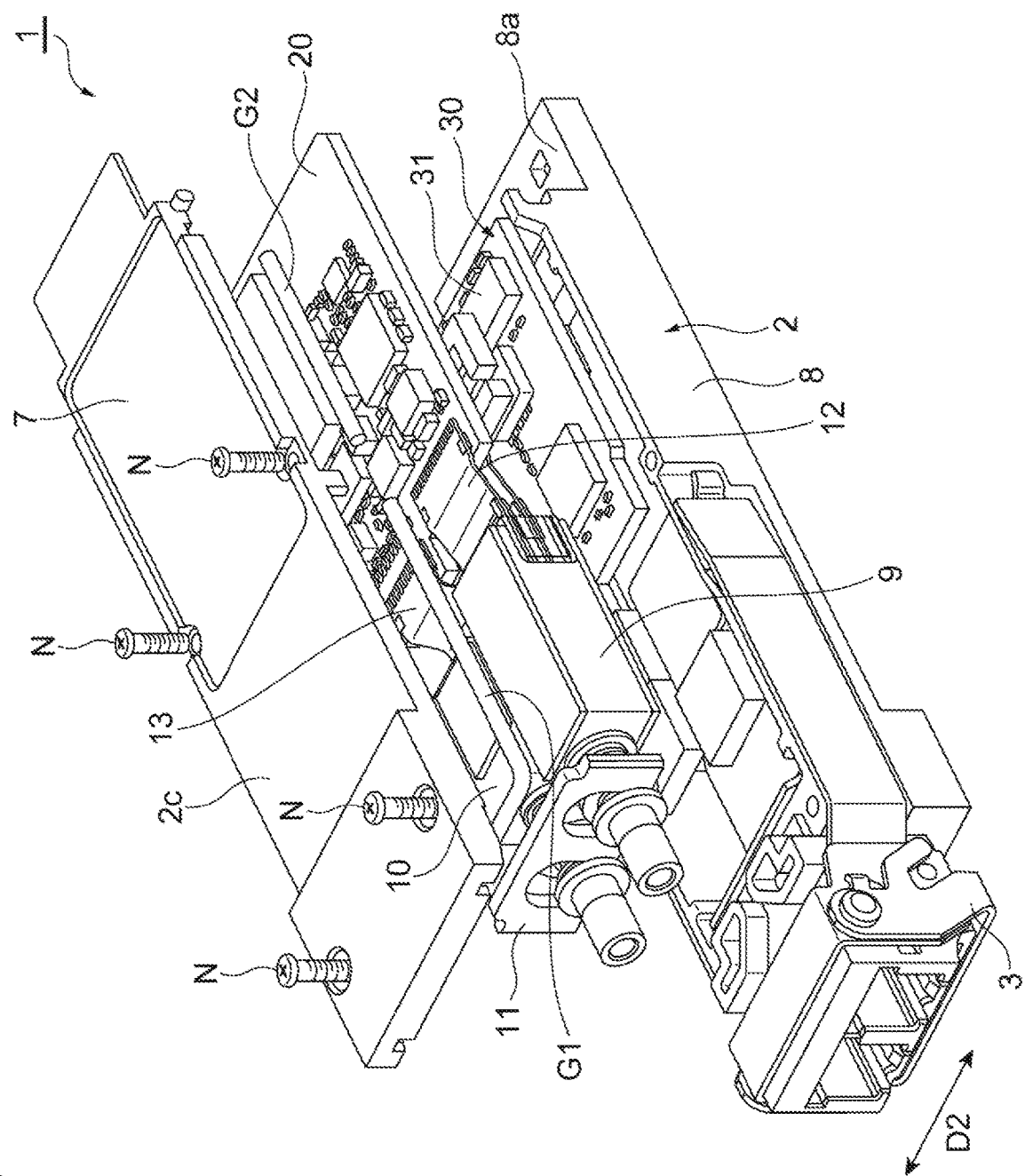
FIG. 2 is an exploded perspective view of the optical transceiver of FIG. 1.

FIG. 2 is an exploded perspective view of the optical transceiver 1 of FIG. 1 when inverted upside down and disassembled. As shown in FIG. 2, the housing 2 includes a lower housing 7 having the bottom surface 2c, and an upper housing 8 having the upper surface 2b. The lower housing 7 and the upper housing 8 are joined to each other with a plurality of screws N. When The lower housing 7 and the upper housing 8 are joined to each other, gaskets G1 and G2 can be interposed therebetween. For example, a TOSA (transmitter optical sub-assembly) 9, a ROSA (receiver optical sub-assembly) 10, and a retainer 11 are stored inside the housing 2. More specifically, the lower housing 7 and the upper housing defines an internal space inside the housing 2. The TOSA 9, the ROSA 10, the retainer 11 are arranged in the internal space.

The TOSA 9 and the ROSA 10 are juxtaposed along a direction D2 that is the width direction of the optical transceiver 1. The direction D2 is orthogonal to the direction D1. The TOSA 9 comprises, for example, a light emitting device such as a semiconductor laser diode, and converts an electrical signal into an optical signal. The ROSA 10 comprises, for example, a light receiving device such as a photodetector, and converts an optical signal into an electrical signal. The TOSA 9 and the ROSA 10 concurrently operate independently each other, thereby performing full duplex bidirectional optical communication. The retainer 11 is formed by, for example, an electroconductive material. The retainer 11 fixes the respective sleeves of the TOSA 9 and the ROSA 10 to the housing 2. The retainer 11 allows the TOSA 9 and the ROSA 10 to be fixed at predetermined positions inside the housing 2.

Figure 3:
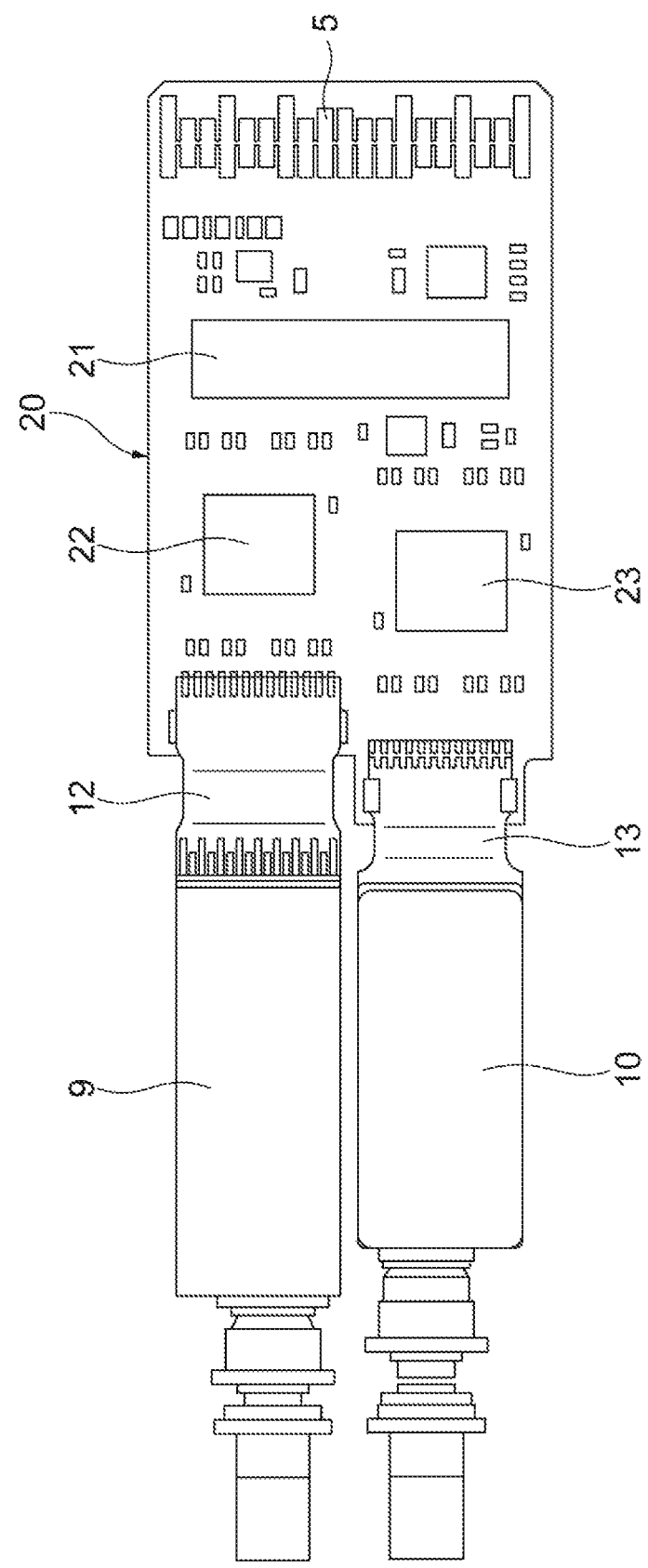
FIG. 3 is a plan view showing a first printed circuit board and an optical sub-assembly of the optical transceiver of FIG. 1.

FIG. 3 is a plan view showing a first printed circuit board 20 to which the TOSA 9 and the ROSA 10 are connected. FIG. 3 shows a state when the upper surface of the first printed circuit board 20 is viewed from above. As shown in FIGS. 2 and 3, further, two FPC (flexible printed circuit) 12, 13, the first printed circuit board 20 and a second printed circuit board 30 are arranged inside the internal space of the housing 2. The FPC 12 electrically connects the TOSA 9 and the first printed circuit board 20. The FPC 13 electrically connects the ROSA 10 and the first printed circuit board 20.

In short, the ROSA 10 converts an optical signal received from the outside of the optical transceiver 1 into an electrical signal. The electrical signal is transmitted to the first printed circuit board 20 through the FPC 13. A circuit mounted on the first printed circuit board 20 performs signal processing on the electrical signal, and the electrical signal subjected to the signal processing is output to the host system (optical transmission device) through the electrical plug 5.

On the other hand, an electrical signal for transmission is input from the host system to the first printed circuit board 20 through the electrical plug 5. The electrical signal for transmission is processed by the circuit mounted on the first printed circuit board 20, and then transmitted to the TOSA 9 through the FPC 12. The TOSA 9 converts the electrical signal for transmission into an optical signal, and then transmits the optical signal to the outside of the optical transceiver 1. It should be noted that high-speed electrical signals which are mutually converted into or from optical signals to be transmitted or received and electrical signals which are processed by the above signal processing (for example, a plurality of electrical signals to be demultiplexed from high-speed electrical signals and a plurality of electrical signals to be multiplexed into high speed electrical signals) include information which is transmitted as a physical layer of the network by the optical transceiver, and are hereinafter referred to as the main signals.

The second printed circuit board 30 is arranged between the first printed circuit board 20 and an inner surface 8a (first surface) of the upper housing 8. Mounted on the second printed circuit board 30 is an IC which does not handle the main signals directly as input and output signals, for example, a microcomputer, a control IC, or a memory. For example, the IC mounted on the second printed circuit board 30 often handles electrical signals whose signal speed is slower than that of the main signals, for example, for performing communications for the control of the TOSA 9 and the ROSA 10 inside the optical transceiver, or supervisory control with the host system, and consumes less power compared to the IC handling the main signals.

Electrical connectors 21, 31, which are stacking connectors, are provided on the first printed circuit board 20 and the second printed circuit board 30, respectively. One of the electrical connectors 21, 31 is a female connector, and the other is a male connector. The inner face of the female connector and the outer face of the male connector are provided with electrodes (terminals) which are electrically connected to each other. Fitting the electrical connectors 21, 31 to each other allows an electrical connection between the first printed circuit board 20 and the second printed circuit board 30 to be secured. The shapes of the male connector and the female connector may be formed to fit with each other. Fitting these connectors also allows the first printed circuit board 20 and the second printed circuit board 30 to be physically firmly fixed to each other.

Figure 4:
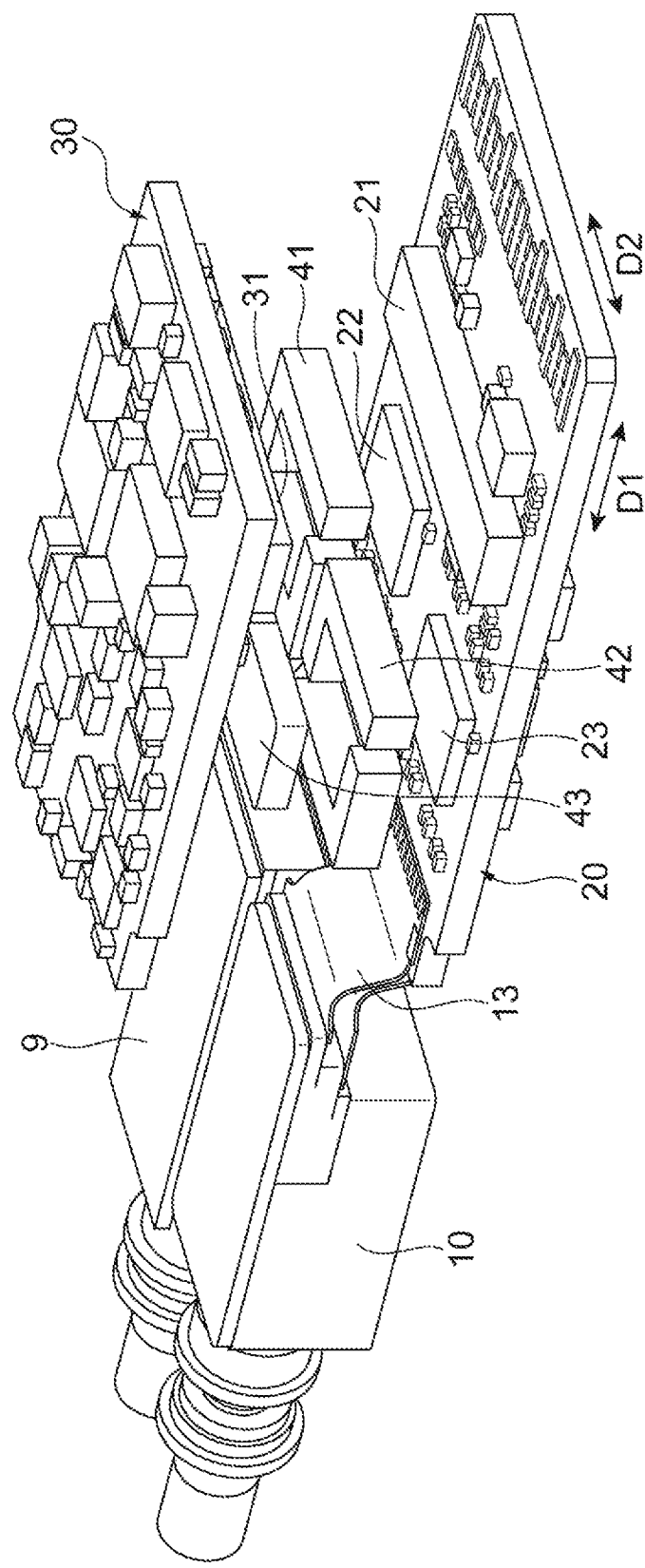
FIG. 4 is a perspective view showing the first printed circuit board, second printed circuit board, and optical sub-assembly of FIG. 3.

FIG. 4 is a perspective view showing the first printed circuit board 20 and the second printed circuit board 30. As shown in FIGS. 3 and 4, a CDR (clock data recovery) 22 on the transmitter side and a CDR 23 on the receiver side are provided as a circuit on the first printed circuit board 20 that performs signal processing on electrical signals. For example, both the CDRs 22, 23 have a rectangular planar shape. The CDRs 22, 23 are both mounted on the first printed circuit board 20 through, for example, a BGA (ball grid array). The surface of the first printed circuit board 20 on which the CDRs 22, 23 are surface-mounted is hereinafter referred to as the component surface. The surface opposite to the component surface of the first printed circuit board 20 is hereinafter referred to as the solder surface. Some electrical parts may be mounted on the solder surface.

The CDRs 22, 23 are circuit units for shaping waveforms or eye patterns of an electrical signal. The CDRs 22, 23 are heat generating components consuming electric power to process high-speed electrical signals such as main signals. Overheating the CDRs 22, 23 may cause a failure thereof. In order to avoid overheating of the CDRs 22, 23, it is necessary to dissipate the Joule heat during consumption of electric power. In short, in the present example, the CDRs 22, 23 are heat generating components generating heat by consuming electric power. The first printed circuit board 20 may comprise the electrical plug 5 on the rear side to which the host system is to be connected. The rear side is opposite to the side (front side) to which the FPCs 12, 13 are to be connected. The first printed circuit board 20 with the electrical plugs 5 allows the optical transceiver 1 to handle the main signals only on the first printed circuit board 20, efficiently transmit the electrical signals, and reduce deterioration of the waveform quality of the electrical signals.

Figure 5:
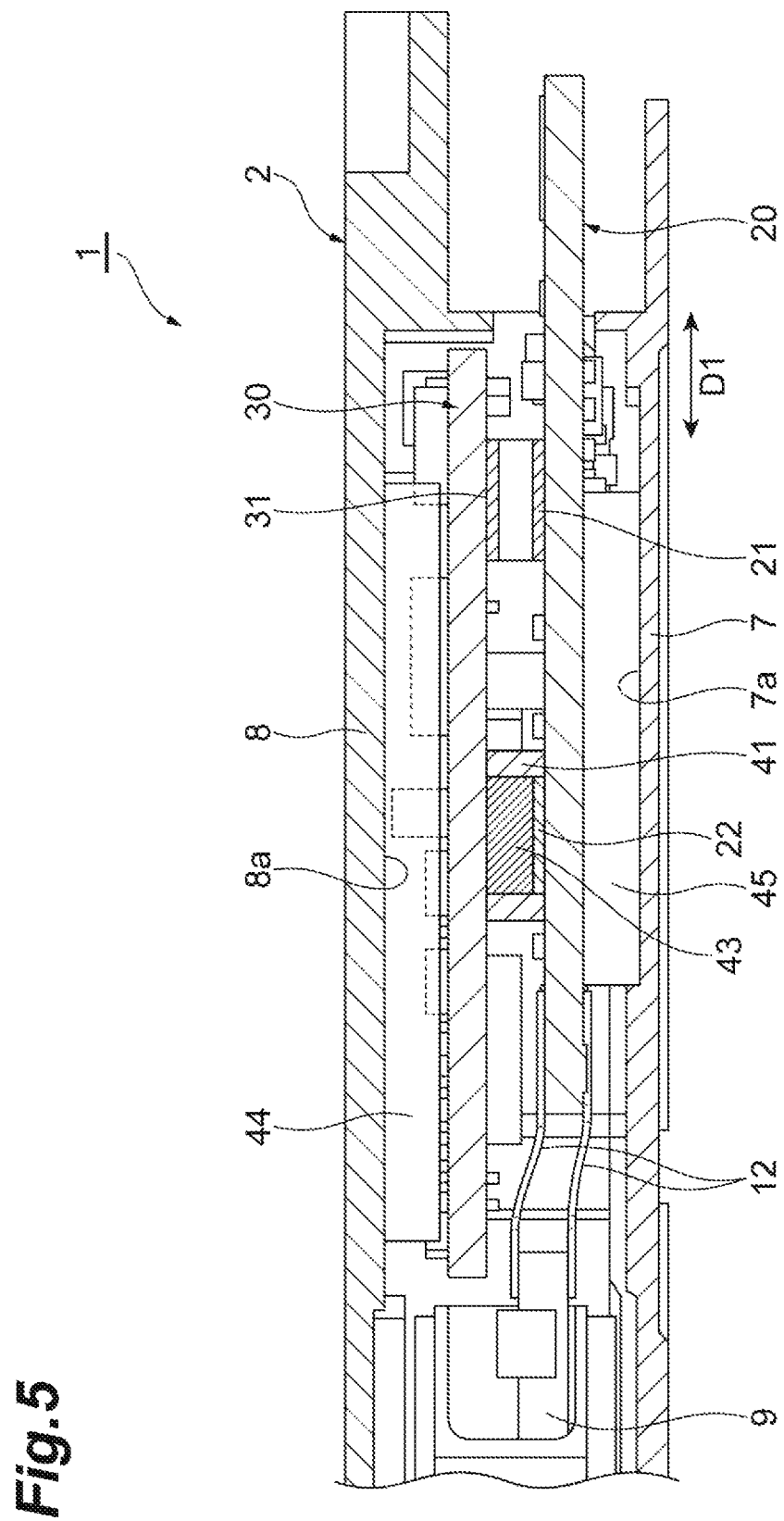
FIG. 5 is a longitudinal sectional view of the optical transceiver of FIG. 1.

FIG. 5 is a longitudinal sectional view of the housing 2, the first printed circuit board 20 and the second printed circuit board 30. As shown in FIGS. 4 and 5, the optical transceiver 1 comprises a protection member 41 for protecting the CDR 22, a protection member 42 for protecting the CDR 23, and a thermal conductive gel 43 placed on each of the CDRs 22, 23. The CDRs 22, 23 are arranged between the first printed circuit board 20 and the second printed circuit board 30. For example, the CDRs 22, 23 are mounted on the plane of the surface (component surface) of the first printed circuit board 20 facing the second printed circuit board 30.

For example, the thermal conductive gel 43 includes a dielectric and may contain aluminum oxide. Such materials can further increase the thermal conductivity of the thermal conductive gel 43. For example, the protection member 41 and the protection member 42 can mutually have the same shape, the same material, and the same function so that the protection member 41 and the protection member 42 can surround the periphery of the CDRs 22, 23. Hence, hereinafter, the protection member 41 will be mainly described, and the description of the protection member 42 which is common to the protection member 41 will be appropriately omitted as redundant.

The protection member 41 is arranged between the first printed circuit board 20 and the second printed circuit board 30. The protection member 41 functions as a spacer defining the interval between the first printed circuit board 20 and the second printed circuit board 30. Therefore, in addition to the electrical connectors 21, 31, the first printed circuit board 20 and the second printed circuit board 30 can be supported with a predetermined interval (distance) therebetween by the protection member 41 (protection member 42).

The protection member 41 (protection member 42) has a surface (lower surface) in surface contact with the first printed circuit board 20, and a surface (upper surface) in surface contact with the second printed circuit board 30. The upper surface and the lower surface of the protection member 41 (protection member 42) are formed substantially parallel with each other. The distance between the upper surface and the lower surface of the protection member 41 (protection member 42) corresponds to the height of the protection member 41 (protection member 42). More specifically, the upper surface of the protection member 41 (protection member 42) is in surface contact with the lower surface (solder surface) of the second printed circuit board 30. The lower surface of the protection member 41 (protection member 42) is in surface contact with the upper surface (component surface) of the first printed circuit board 30. The above-mentioned predetermined interval is defined by this height. Therefore, the protection member 41 (protection member 42) prevents the first printed circuit board 20 and the second printed circuit board 30 from being inclined to each other, and secures parallelism of the first printed circuit board 20 and the second printed circuit board 30. Consequently, the protection member 41 (protection member 42) allows the optical transceiver 1 to avoid unintentional contact between components inside the housing 2, and allows a production line to secure stable assembling performance of the optical transceiver 1.

The protection member 41 (protection member 42) is arranged on the upper surface (component surface) of the first printed circuit board 20 to surround the CDR 22 (CDR 23). The protection member 41 (protection member 42) is arranged to be sandwiched between the first printed circuit board 20 and the second printed circuit board 30 to maintains parallelism thereof. The height of the protection member 41 (protection member 42) on the first printed circuit board 20 is higher than the height of the CDR 22 mounted on the first printed circuit board 20. The protection member 41 is formed by, for example, an elastic body. The protection member 41 may be formed by, for example, silicone rubber. In this case, since the protection member 41 exhibits an electrically insulating function, it is possible to reduce influence on other components, such as electrical contact.

The elastic modulus of the protection member 41 is smaller than either of the elastic modulus of the first printed circuit board 20 and the elastic modulus of the second printed circuit board 30. The protection member 41 is softer than the first printed circuit board 20 and the second printed circuit board 30. Therefore, even if a pressing force is exerted on the protection member 41 by the first printed circuit board 20 and the second printed circuit board 30, since the repulsive force by the protection member 41 is so small sufficient to avoid deformation of the first printed circuit board 20 and the second printed circuit board 30. For example, when a force of about 15 N is applied by each of the first printed circuit board 20 and the second printed circuit board 30, the protection member 41 causes a repulsive force of about 25 N which is smaller than the total stress of 30 N. The protection member 41 has an appropriate hardness, thereby supporting the first printed circuit board 20 and the second printed circuit board 30 with the predetermined interval (distance) therebetween as described above.

The thermal conductive gel 43 is a gel-like heat dissipation member (heat dissipation gel) having elasticity and thermal conductivity. The thermal conductive gel 43 is placed on the CDR 22 surrounded by the protection member 41, and adheres to the CDR 22, the protection member 41 and the second printed circuit board 30. Consequently, the thermal conductive gel 43 is thermally and physically in contact with the CDR 22. Therefore, the Joule heat of the CDR 22 is conducted to the second printed circuit board 30 through the thermal conductive gel 43, and also to the first printed circuit board 20. The protection member 41 and the thermal conductive gel 43 will be described in detail later.

Moreover, the housing 2 has an inner surface 7a of the lower housing 7, and an inner surface 8a of the upper housing 8 facing the inner surface 7a. The first printed circuit board 20 is arranged between the lower housing 7 and the upper housing 8. The component side of the first printed circuit board 20 faces the upper housing 8. The second printed circuit board 30 is arranged between the first printed circuit board 20 and the upper housing 8. A heat dissipation sheet 44 (first heat dissipation sheet) is provided between the second printed circuit board 30 and the inner surface 8a of the upper housing 8. A heat dissipation sheet 45 is provided between the first printed circuit board 20 and the inner surface 7a (second surface) of the lower housing 7. The elastic modulus of the protection member 41 is greater than the elastic modulus of each of the heat dissipation sheets 44, 45. The heat dissipation sheets 44, 45 are softer than the protection member 41, and may be formed by, for example, a gel-like material. Whereas, the protection member 41 harder than the heat dissipation sheets 44, 45 prevents inclination of the first printed circuit board 20 and the second printed circuit board 30. Further, as described above, the protection member 41 is softer than the first printed circuit board 20 and the second printed circuit board 30. Therefore, the function of reducing the inclination of the first printed circuit board 20 and the second printed circuit board 30 depends on the respective elastic moduli.

In addition, after the protection member 41 (protection member 42) is provided around the CDR 22 (CDR 23) and the thermal conductive gel 43 is filled into a space between the protection member 41 (protection member 42) and the CDR 22 (CDR 23), the second printed circuit board 30 is placed from the upper housing 8 side. At this time, the first printed circuit board 20 and the second printed circuit board 30 receive compression forces from above and below by the heat dissipation sheets 44, 45. The compression forces and the repulsive force of the protection member 41 prevents the inclination of the first printed circuit board 20 and the second printed circuit board 30 and interference between components mounted on the first printed circuit board 20 or the second printed circuit board 30. Furthermore, it is possible to prevent disconnection of the electrical connectors 21, 31, etc., and it is also possible to keep a constant interval between the first printed circuit board 20 and the second printed circuit board 30. Additionally, when the viscosity of the thermal conductive gel 43 is low, the protection member 41 (protection member 42) prevents the thermal conductive gel 43 from freely flowing out and spreading around the CDR 22 (CDR 23), and maintains the thermal conductive gel 43 having an amount necessary for the thermal conductive gel 43 to contact both the CDR 22 (CDR 23) and the second printed circuit board 30 within an inner space surrounded by the protection member 41 (protection member 42).

The heat dissipation sheet 44 adheres to the inner surface 8a and the second printed circuit board 30. The heat dissipation sheet 45 adheres to the inner surface 7a and the first printed circuit board 20. It should be noted that the adhesion referred to here may include not only surface contact with the surface of each of the printed circuit boards, but also partial contact with the surface of the components mounted on the surface. In short, it suffices to form a thermal conduction path through physical contact. The heat dissipation sheet 44 increases the thermal conductivity from the second printed circuit board 30 to the upper housing 8, and the heat dissipation sheet 45 increases the thermal conductivity from the first printed circuit board 20 to the lower housing 7. The Joule heat of the CDRs 22, 23 is conducted to the upper housing 8 through a heat dissipation path (upper dissipation path) configured by the thermal conductive gel 43, the second printed circuit board 30, and the heat dissipation sheet 44. Therefore, the heat from the CDRs 22, 23 conducted to the upper housing 8 can be transmitted to a heat sink of the cage of the host system located on the upper side of the upper housing 8. Thus, efficiently dissipation of the Joule heat of the CDRs 22, 23 to the heat sink through the heat dissipation path prevents the CDRs 22, 23 from being overheated.

Moreover, the Joule heat of the CDRs 22, 23 is also conducted to the lower housing 7 through another heat dissipation path (lower dissipation path) configured by the first printed circuit board 20 and the heat dissipation sheet 45. As described above, the thermal conductive gel 43 and the heat dissipation sheets 44, 45 provides the heat dissipation channels (upper dissipation path and lower dissipation path) from the CDRs 22, 23 to the housing 2. In addition, not only the heat of the first printed circuit board 20 itself caused by the components other than the CDRs 22, 23 but also the heat of the second printed circuit board 30 itself can be dissipated through the heat dissipation channels.

Figure 6:
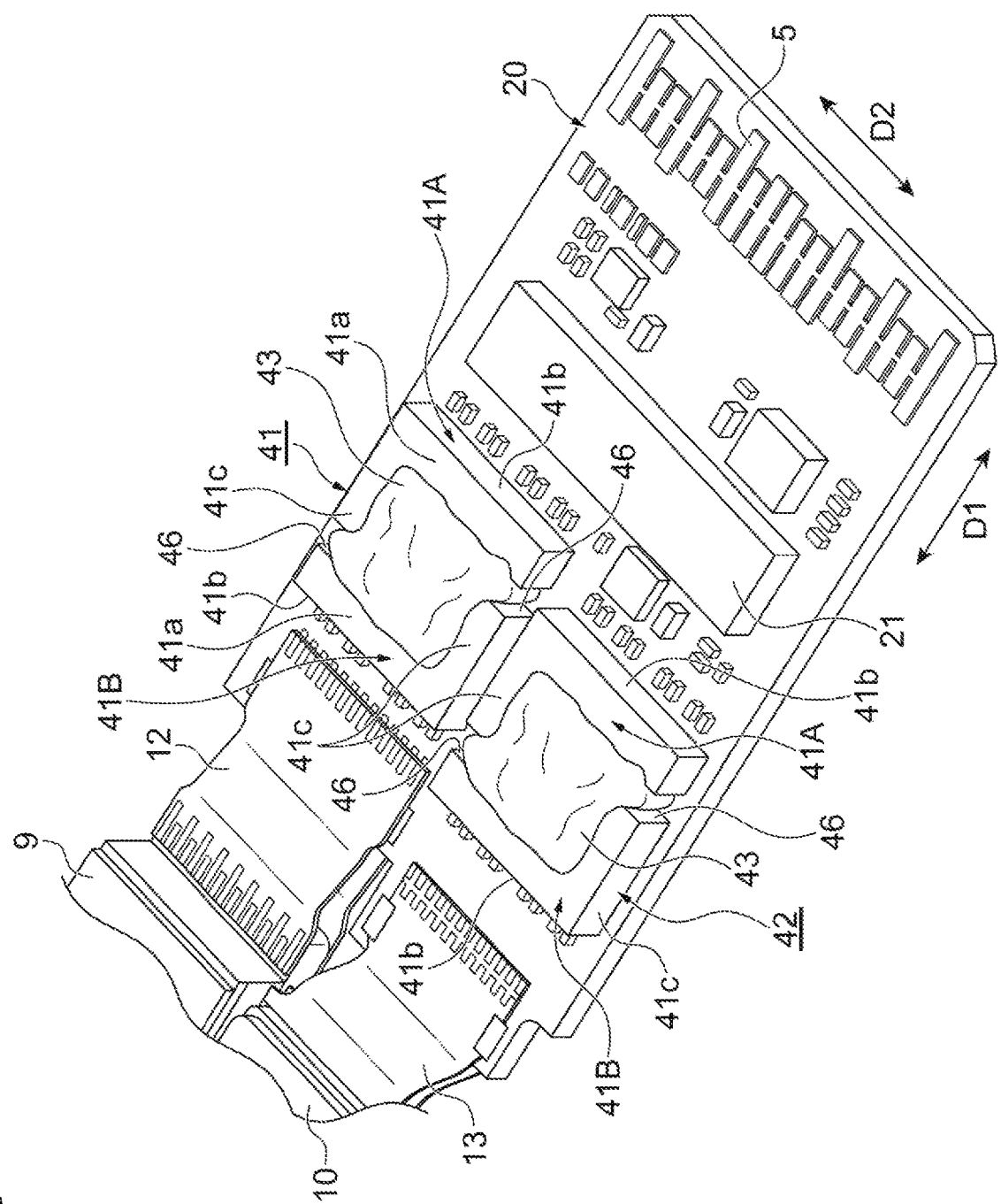
FIG. 6 is a perspective view showing a protection member mounted on the first printed circuit board of FIG. 3.

FIG. 6 is a perspective view showing the protection members 41, 42 surrounding the CDRs 22, 23, respectively, and the thermal conductive gel 43 placed on the CDRs 22, 23. As shown in FIG. 6, for example, the protection member 41 includes a plurality of individual pieces 41A, 41B which have an L-shaped bottom surface 41a. The individual piece 41A and the individual piece 41B are placed at mutually symmetrical (point-symmetric) positions with respect to the center (center point) of the CDR 22, for example, on the component surface. Like the protection member 41, the protection member 42 includes the individual piece 41A and the individual piece 41B. The individual pieces 41A, 41B of the protection member 41 are arranged to align with the corners of the CDR 22. The individual pieces 41A, 41B of the protection member 42 are arranged to align with the corners of the CDR 23.

Specifically, the individual piece 41A includes a first portion 41b forming a vertical bar of the L shape, and a second portion 41c forming a horizontal bar of the L shape. The longitudinal direction of the first portion 41b forms a right angle with the longitudinal direction of the second portion 41c. The individual piece 41A is arranged so that the first portion 41b is along one side of the rectangular CDR 22, and the second portion 41c is along another side of the CDR 22 (the side adjacent to the one side). For example, the individual piece 41B can have the same shape, the same size and the same material as the individual piece 41A. The individual piece 41B has the first portion 41b and the second portion 41c.

When one side of the CDR 22 and one side of the CDR 23 are arranged to be parallel with each other on the component surface, the first portion 41b of the individual piece 41B is arranged along one side of the CDR 22 to be parallel with the first portion 41b of the individual piece 41A. Simultaneously, the second portion 41c of the individual piece 41B is arranged along another side of the CDR 22 to be parallel with the second portion 41c of the individual piece 41A. Thus, the individual pieces 41A, 41B are arranged along each side of the CDR 22 (CDR 23). As a result, parallelism of the first printed circuit board 20 and the second printed circuit board 30 can be more reliably secured. The space between the upper surface of the first printed circuit board 20 and the lower surface of the second printed circuit board 30 also depends on the height when the aforementioned electrical connectors 21, 31 are fitted together. Therefore, the heights of the individual pieces 41A, 41B may be preferably set at a value substantially equal to the height when the electrical connectors 21, 31 are fitted together.

The protection member 41 (protection member 42) has an opening 46 into which a part of the thermal conductive gel 43 is extruded. The opening 46 is provided, for example, at a plurality of points of the protection member 41. A plurality of the openings 46 are provided at positions symmetrical to each other with respect to the center of the CDR 22 in plan view. For example, the opening 46 is a gap formed between the individual piece 41A and the individual piece 41B. Each opening 46 is formed in a rectangular shape between the individual piece 41A and the individual piece 41B. Each opening 46 is provided for receiving an excess of the thermal conductive gel 43. Consequently, the thermal conductive gel 43 is in contact with each of the openings 46.

The length and the height of each of the individual pieces 41A, 41B are determined according to the length and the height of each side of the CDR 22 (CDR 23). Even when a large amount of the thermal conductive gel 43 is filled in the inner space surrounded by the individual pieces 41A, 41B, the openings 46 allows an excess of the thermal conductive gel 43 to be discharged. On a side (the front side) in the direction D1 of the CDR 22 (CDR 23), many signal lines passing through the above-mentioned FPC boards 12, 13, etc. are arranged. Therefore, for example, the openings 46 are oriented in the direction D2 that is the width direction of the optical transceiver 1. In this case, guiding the excess of the thermal conductive gel 43 in the direction D2 prevents the dielectric included in the thermal conductive gel 43 from reaching the signal lines and degrade the high-frequency characteristics of the signals.

An example of the sizes of the CDR 22 and the protection member 41 will be described. The length of the CDR 22 in the direction D1 is 4.0 mm, the length of the CDR 22 in the direction D2 is 4.5 mm, and the height of the CDR 22 with reference to the component surface of the first printed circuit board 20 is 0.6 mm. The distance between the first printed circuit board 20 and the second printed circuit board 30 is 1.5 mm. The height of the protection member 41 is 1.5 mm. Accordingly, the distance between the upper surface of the CDR 22 and the second printed circuit board 30 (the height of the filled thermal conductive gel 43) is 0.9 mm.

Figure 7:
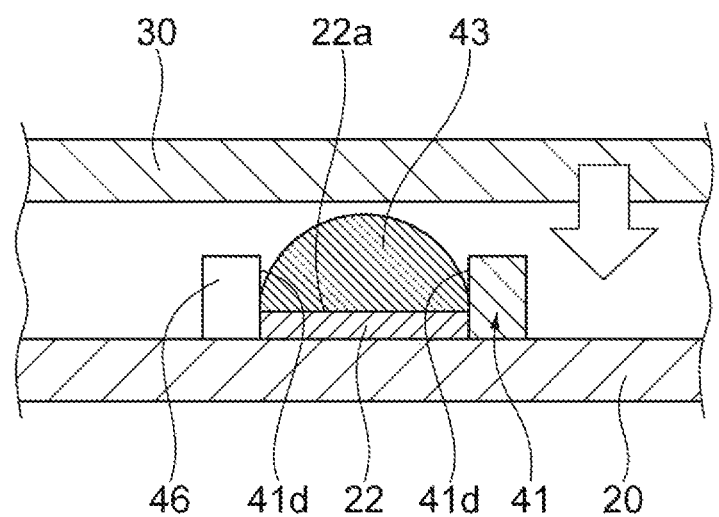
FIG. 7 is a longitudinal sectional view schematically showing a thermal conductive gel applied onto an electronic component of the optical transceiver of FIG. 1.
Figure 8:
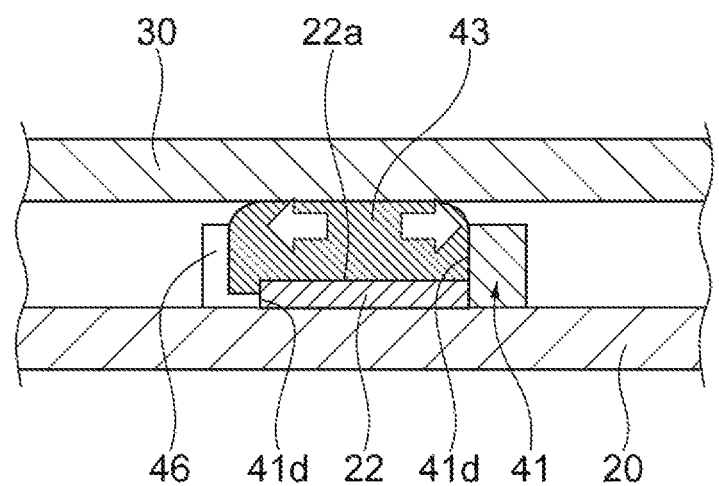
FIG. 8 is a longitudinal sectional view schematically showing a state in which the second printed circuit board is pressed against the thermal conductive gel of FIG. 7 from above.
Figure 9:
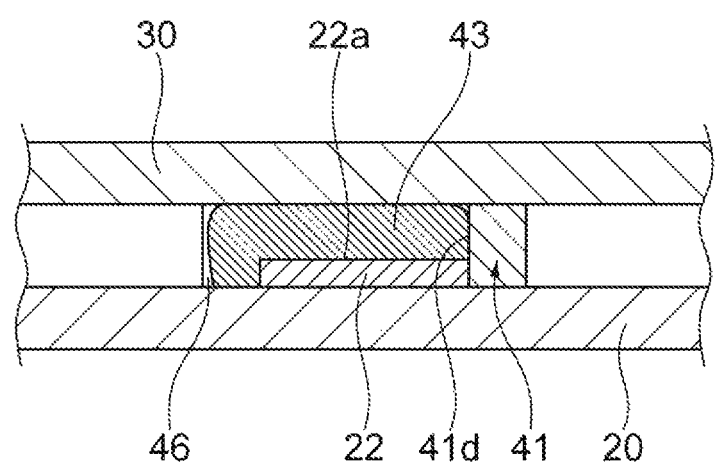
FIG. 9 is a longitudinal sectional view schematically showing a state in which the second printed circuit board is pressed against the thermal conductive gel of FIG. 8 from above.

FIGS. 7, 8, and 9 are cross-sectional views schematically showing a state in which the thermal conductive gel 43 is filled to fill in the space between an upper surface 22a of the CDR 22 and the second printed circuit board 30. As shown in FIG. 7, a slightly larger amount (for example, 1.1 to 1.3 times more) of the thermal conductive gel 43 than the volume of the inner space of the protection member 41 formed by the upper surface 22a and inner surfaces 41d of the protection member 41 is filled. Filling such a large amount of the thermal conductive gels 43 surely produces the heat dissipation path from the CDR 22 to the second printed circuit board 30 through the thermal conductive gel 43. For example, when the volume of the inner space of the protection member 41 is 16.2 mm$^3$ (4.0 mm×4.5 mm×0.9 mm), the amount of the thermal conductive gel 43 to be filled into the inner space of the protection member 41 is not less than 16.2 mm$^3$ and not more than 18.0 mm$^3$ (4.0 mm×4.5 mm×1.0 mm).

As shown in FIGS. 8 and 9, during assembly of the optical transceiver 1, when the second printed circuit board 30 is pressed against the thermal conductive gel 43 filled in the inner space of the protection member 41 from above, the area of a portion of the thermal conductive gel 43 in contact with the second printed circuit board 30 is larger than the area of the first printed circuit board 20 (the upper surface 22a) occupied by the CDR 22. Moreover, with the pressing the second printed circuit board 30 from above, a part of the thermal conductive gel 43 flows and enters into each opening 46. For example, when the filling amount of the thermal conductive gel 43 is 18.0 mm$^3$, 1.8 mm$^3$ of the thermal conductive gel 43 is extruded by pressing the second printed circuit board 30. Therefore, the volume of the openings 46 is set to a size that allows receiving of 1.8 mm$^3$ of the thermal conductive gel 43. As the thermal conductive gel 43 is extruded, the thermal conductive gel 43 contacts the openings 46. One example of the volume of each opening 46 is 3.0 mm$^3$. However, the size of the openings 46 is appropriately determined according to the shape of the protection member 41 and the amount of the thermal conductive gel 43.

Next, the functions and effects obtained from the optical transceiver 1 will be described in detail. In the optical transceiver 1, the CDR 22 is mounted on the first printed circuit board 20, and the protection member 41 is arranged to surround the periphery of the CDR 22. The thermal conductive gel 43 is provided to be in contact with each of the CDR 22, the protection member 41 and the second printed circuit board 30. The thermal conductive gel 43 having fluidity as a medium for conducting heat from the CDR 22 relaxes the mechanical load (for example, pressure) exerted on the CDR 22. Further, arranging the protection member 41 to surround the CDR 22 prevents the thermal conductive gel 43 from freely flowing from the CDR 22.

Furthermore, the protection member 41 has the openings 46 into which the thermal conductive gel 43 flows and is extruded. Therefore, an excess of the filled thermal conductive gel 43 can be extruded into the openings 46. Accordingly, filling a larger amount of the thermal conductive gel 43 secures adhesion of the thermal conductive gel 43 to the CDR 22. For example, when the excessive thermal conductive gel 43 stays on the CDR 22, there is a possibility that the thermal conductive gel 43 flows out of the inner space of the protection member 41 and makes the distance between the first printed circuit board 20 and the second printed circuit board 30 larger than the predetermined value. Accordingly, the thermal conductive gel 43 having a volume larger than the volume of the inner space can cause the first printed circuit board 20 and the second printed circuit board 30 to somewhat warp or become unparallel to each other. The openings 46 allows such an inconvenience to be avoided. Therefore, it is possible to certainly arrange the thermal conductive gel 43 to adhere to the CDR 22 and also to bring the upper surface and the lower surface of the protection member 41 into surface contact with the second printed circuit board 30 and the first printed circuit board, respectively. As a result, the configuration of the first printed circuit board 20, the second printed circuit board 30, and the protection member 41 (protection member 42) therebetween efficiently enhances the heat dissipation performance. Specifically, the Joule heat generated from the CDR 22 is reliably conducted to the second printed circuit board 30 through the thermal conductive gel 43.

Moreover, the heat dissipation sheet 44 is arranged between the second printed circuit board 30 and the inner surface 8a of the housing 2. The heat dissipation sheet 45 is arranged between the first printed circuit board 20 and the inner surface 7a of the housing 2. Therefore, the heat conducted to each of the first printed circuit board 20 and the second printed circuit board 30 is further conducted to the housing 2 through the heat dissipation sheet 44 and the heat dissipation sheet 45, respectively. Thus, the optical transceiver 1 can secure the heat dissipation channels from the CDR 22 to the housing 2.

In addition, the elastic modulus of the protection member 41 is greater than either of the elastic modulus of the heat dissipation sheet 44 and the elastic modulus of the heat dissipation sheet 45. Accordingly, the protection member 41 is harder than the heat dissipation sheets 44, 45. Therefore, interposing the protection member 41 between the first printed circuit board 20 and the second printed circuit board 30 allows the distance between the first printed circuit board 20 and the second printed circuit board 30 to be a predetermined value. Thus, the protection member 41 can work as a spacer interposed between the first printed circuit board 20 and the second printed circuit board 30.

Further, the elastic modulus of the protection member 41 is smaller than either of the elastic modulus of the first printed circuit board 20 and the elastic modulus of the second printed circuit board 30. Accordingly, the first printed circuit board 20 and the second printed circuit board 30 are harder than the protection member 41. Therefore, it is possible to prevent the first printed circuit board 20 and the second printed circuit board 30 from warping when the thermal conductive gel 43 is filled and the first printed circuit board 20 and the second printed circuit board 30 are assembled.

Moreover, the protection member 41 is formed by a plurality of individual pieces 41A, 41B. The opening 46 is a gap formed between one individual piece 41A and another individual piece 41B. Therefore, when a plurality of individual pieces 41A, 41B are arranged around the CDR 22, the opening 46 into which the thermal conductive gel 43 is extruded can be formed. Further, since the gap formed between the two individual pieces 41A, 41B is the opening 46, there is no need to form an opening in the individual pieces 41A, 41B themselves. Consequently, it is possible to increase the degree of freedom in the shapes of the individual pieces 41A, 41B. In addition, the size of the opening can be adjusted by varying the distance between the individual pieces 41A, 41B. Thus, it is possible to adjust the amount of the thermal conductive gel 43 which is allowed to escape into the opening 46.

Each of the individual pieces 41A, 41B has the L-shaped bottom surface 41a. Both of the individual pieces 41A, 41B mutually have the same height in the direction perpendicular to the bottom surface 41a. Therefore, it is possible to arrange the L-shaped individual pieces 41A, 41B to align with the corners of the CDR 22. Moreover, when the individual pieces 41A, 41B are L-shaped, the individual pieces 41A, 41B can be arranged on various heat-generating components having sizes different from the CDRs 22, 23. Consequently, it is possible to increase the usability of the protection member 41.

Further, the thermal conductive gel 43 contacts and covers the CDR 22, and is also in contact with the second printed circuit board 30. The area of the portion of the thermal conductive gel 43 in contact with the second printed circuit board 30 is larger than the area occupied by the CDR 22 on the first printed circuit board 20. In short, the contact area of the thermal conductive gel 43 covering the CDR 22 with respect to the second printed circuit board 30 is larger than the area occupied by the CDR 22. Therefore, the CDR 22 can be brought into contact with the second printed circuit board 30 by a larger area through the thermal conductive gel 43. Consequently, it is possible to more efficiently perform heat dissipation of the CDR 22. The above functions and effects can also be obtained similarly from the protection member 42 and the CDR 23.

Second Embodiment

Next, an optical transceiver according to a second embodiment will be described with reference to FIG. 10. The optical transceiver according to the second embodiment is different from the first embodiment in an aspect that this optical transceiver comprises protection members 51, 52 having shapes different from the protection members 41, 42 of the first embodiment. In the following description, explanation common to the first embodiment will be appropriately omitted as redundant. For example, the protection member 51 and the protection member 52 can have the same shape, the same material and the same function. Therefore, hereinafter, the protection member 51 will be mainly described, and redundant explanation will be appropriately omitted for the protection member 52.

Figure 10:
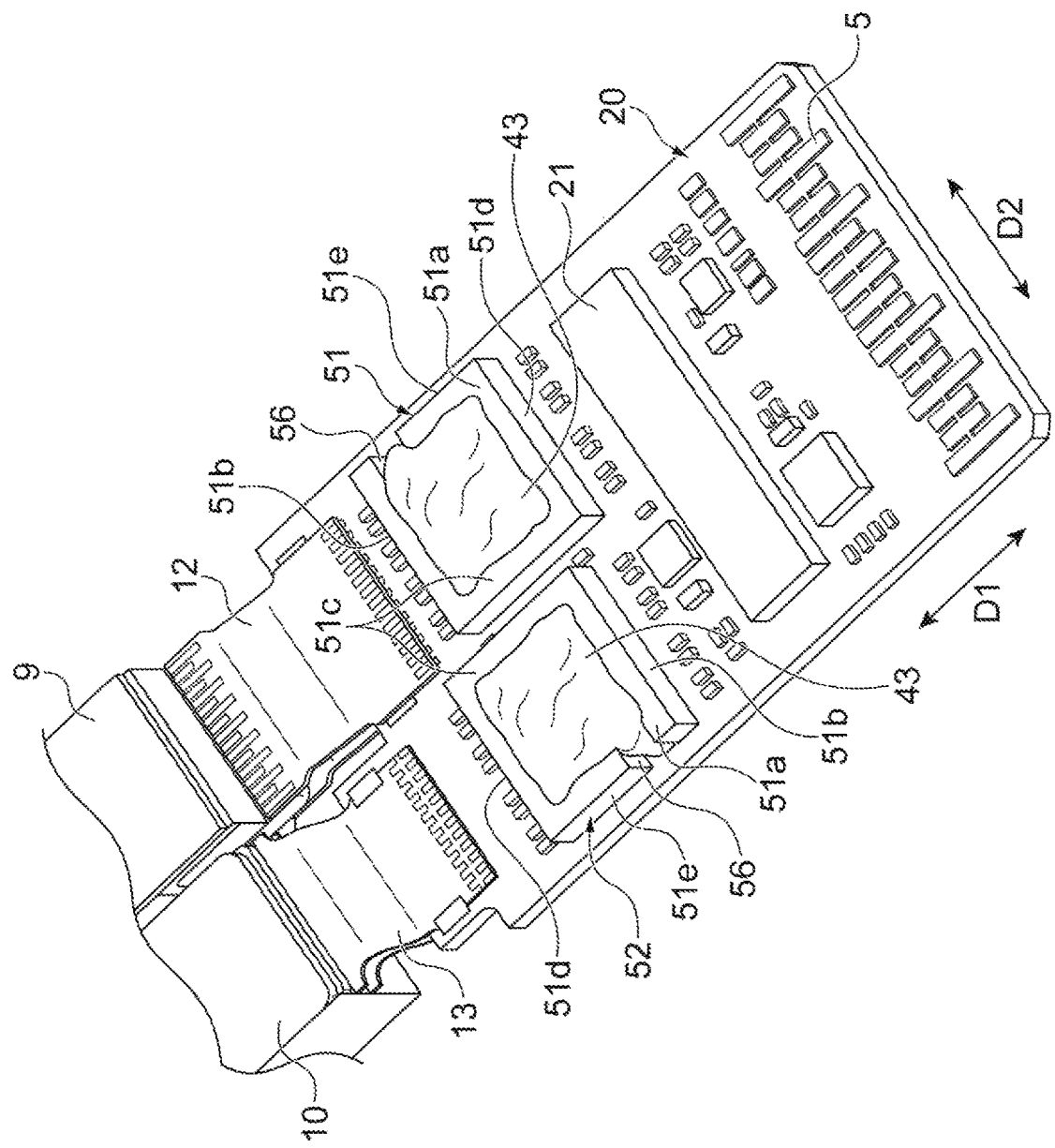
FIG. 10 is a perspective view showing the first printed circuit board and the optical sub-assembly on which a protection member according to a second embodiment is mounted.

As shown in FIG. 10, the protection member 51 does not have the individual pieces 41A, 41B, and is formed as one piece. The protection member 51 has a rectangular partially cutout frame-like bottom surface 51a. The protection member 51 includes a first portion 51b, a second portion 51c, a third portion 51d, and a fourth portion 51e. When one side of the upper surface of the CDR 22 is parallel with the direction D1 and a side adjacent to the one side is parallel with the direction D2, the first portion 51b extends in the direction D2 on the FPC boards 12, 13 side of the CDR 22. The second portion 51c extends along the direction D1 from an end of the first portion 51b located on the center side of the optical transceiver 1 in the direction D2. The third portion 51d extends along the direction D2 from an end of the second portion 51c on the electrical connector 21 side. The fourth portion 51e extends along the direction D1 from an end of the third portion 51d, on both sides in the direction D2 of the optical transceiver 1. The fourth portion 51e does not reach the first portion 51b, and an opening 56 is formed between the fourth portion 51e and the first portion 51b. The opening 56 is oriented to both sides in the direction D2 of the optical transceiver 1. The shape and arrangement of the protection member 51 are determined according to the shape and arrangement of the CDR 22. For example, when the CDR 22 is arranged to incline by 45° with respect to the direction D2, the protection member 51 is also arranged to incline by 45° with respect to the direction D2.

As described above, the optical transceiver according to the second embodiment comprises the protection member 51 surrounding the CDR 22. The thermal conductive gel 43 is provided in contact with each of the CDR 22, the protection member 51 and the second printed circuit board 30. Further, the protection member 51 has the opening 56 into which the thermal conductive gel 43 is extruded. Therefore, the same effects as those of the first embodiment can be obtained. Furthermore, the protection member 51 is formed as one piece. Consequently, it is possible to reduce number of components compared to the protection member 41 of the first embodiment.

Third Embodiment

Figure 11:
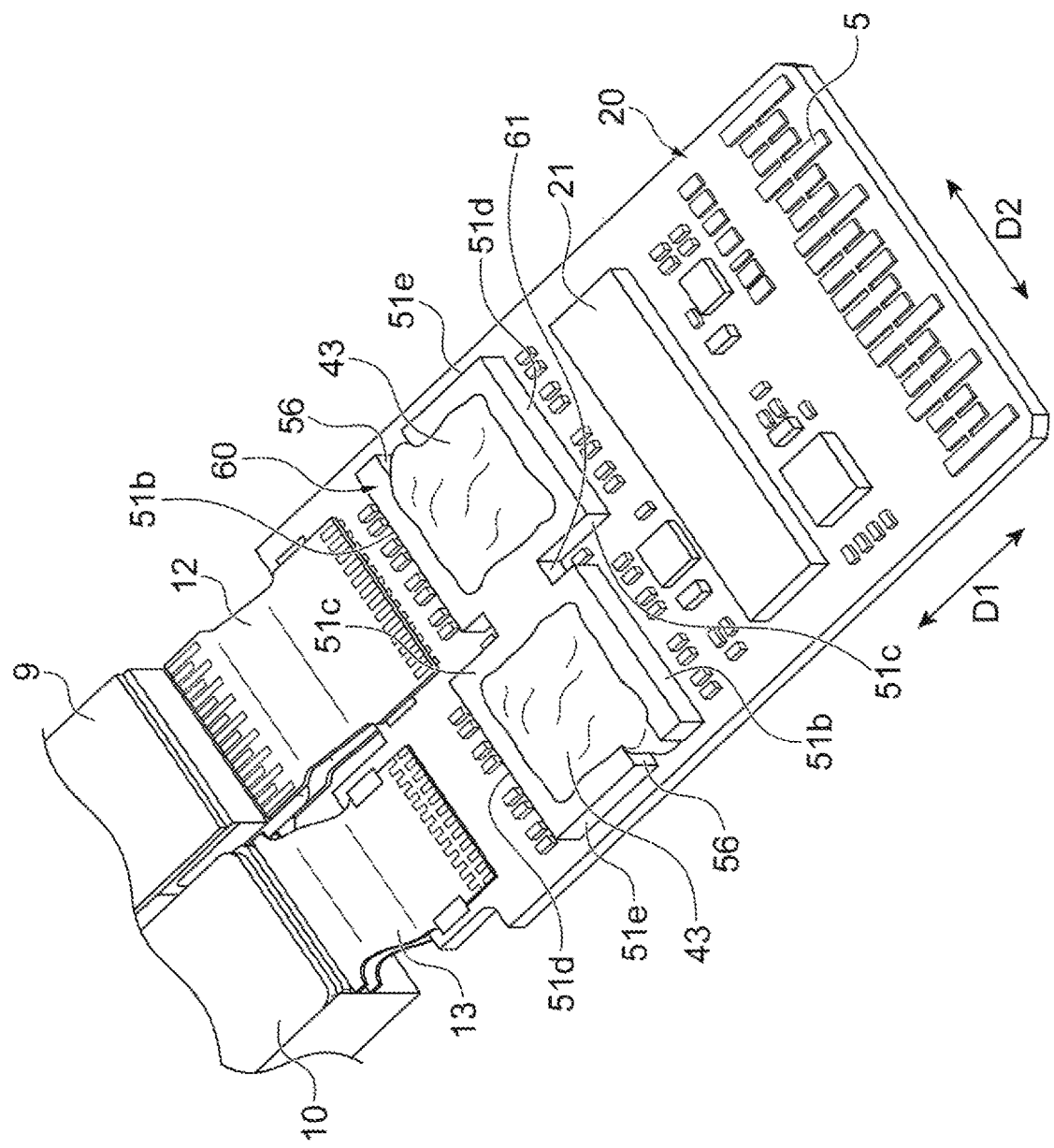
FIG. 11 is a perspective view showing the first printed circuit board and the optical sub-assembly on which a protection member according to a third embodiment is mounted.

Subsequently, an optical transceiver according to a third embodiment will be described with reference to FIG. 11. The optical transceiver according to the third embodiment comprises a protection member 60 having a shape different from the above-described protection members 41, 42, 51, 52. The protection member 60 comprises a pair of the first portions 51b, a pair of the second portions 51c, a pair of the third portions 51d, and a pair of the fourth portions 51e in the direction D2. The protection member 60 comprises a connection part 61 connecting the pair of the second portions 51c to each other. In short, the protection member 60 has a shape in which the portions corresponding to the above-described protection member 51 and the protection member 52 are connected to each other through the connection part 61.

As described above, since the optical transceiver according to the third embodiment comprises the portions corresponding to the same protection members 51 and 52 as in the second embodiment, the same effects as in the second embodiment can be obtained. Additionally, in the third embodiment, the portions corresponding to the protection member 51 and the protection member 52 are connected to each other through the connection part 61. Therefore, it is possible to further reduce the number of components compared to the second embodiment. Furthermore, since the position of the protection member 51 is uniquely determined by the CDR 22 and the CDR 23 when placing the protection member 51 on the second printed circuit board 30, it is easy to place the protection member 51 at a predetermined position, and an assembly work can be performed efficiently.

Although the examples of the optical transceiver according to the present invention were described above, the present invention is not limited to the above examples. In short, those skilled in the art can easily recognize that various modifications and changes can be made within the scope of the gist described in the claims Therefore, the structure of each component of the optical transceiver can be appropriately changed within the scope of the above gist.

For example, in the above-described example, the protection member 41 comprising the L-shaped individual pieces 41A, 41B was described. However, the protection member may comprise two square U-shaped individual pieces, and the shape and the number of individual pieces can be appropriately changed. Further, the size, material and arrangement of the protection member can also be changed as appropriate. The shape, size, number and arrangement of the openings of the protection member are not limited by the above-described openings 46, 56, and can also be changed as appropriate. For example, the openings may not pierce the protection members 41, 51, 60 in the direction D2, or may be openings recessed from the inner surface of the frame-like protection member. Furthermore, in the above example, the thermal conductive gel 43 containing aluminum oxide was described. However, the material of the thermal conductive gel can be appropriately changed.

In the above examples, the optical transceiver 1 comprising the CDRs 22, 23 as heat-generating components was described. However, the number of CDRs may not be two in some case. For example, in the above-described examples, the case where one CDR is used for transmission and one CDR is used for reception was described, but if the CDRs are integrated into a single CDR, it is convenient to prepare a single protection member having a shape corresponding to the shape of the integrated CDR. Further, the heat-generating component may be a component other than the CDR, and the protection member according to the present invention is also applicable to heat-generating components other than the CDR.

In addition, in the above-described examples, the optical transceiver 1 comprising the veil 3 was described. However, the optical transceiver according to the present invention may not comprise the veil 3. The optical transceiver according to the present invention may comprise, for example, a pull tab extending frontward from the housing 2 instead of the veil 3. Furthermore, the type of the optical transceiver and the structure of each component of the optical transceiver can be appropriately changed.

What is claimed is:

1. An optical transceiver comprising:
    a housing having a first surface and a second surface facing to the first surface, an internal space between the first surface and the second surface therein;
    a first printed circuit board arranged between the first surface and the second surface in the internal space;
    a heat generating component mounted on the first printed circuit board, the heat generating component generating heat by consuming electric power;
    a second printed circuit board arranged between the first surface and the first printed circuit board in the internal space;
    a protection member arranged between the first printed circuit board and the second printed circuit board, and also arranged to surround a periphery of the heat generating component in parallel with the first printed circuit board and the second printed circuit board;
    a thermal conductive gel arranged between the first printed circuit board and the second printed circuit board to be in contact with each of at least the heat generating component, the protection member and the second printed circuit board;
    a first heat dissipation sheet arranged between the second printed circuit board and the first surface in the internal space; and
    a second heat dissipation sheet arranged between the first printed circuit board and the second surface in the internal space,
    wherein the protection member surrounds the thermal conductive gel and has an opening in contact with a part of the thermal conductive gel.

2. The optical transceiver according to claim 1, wherein an elastic modulus of the protection member is greater than either of an elastic modulus of the first heat dissipation sheet and an elastic modulus of the second heat dissipation sheet.

3. The optical transceiver according to claim 1, wherein an elastic modulus of the protection member is smaller than either of an elastic modulus of the first printed circuit board and an elastic modulus of the second printed circuit board.

4. The optical transceiver according to claim 1,
wherein the protection member is constituted by a plurality of individual pieces, and
the opening is a gap formed between one of the individual pieces and another of the individual pieces.

5. The optical transceiver according to claim 4, wherein each of the individual pieces has an L-shaped bottom surface, wherein the one of the individual pieces has a same height as the another of the individual pieces in a direction perpendicular to the bottom surface.

6. The optical transceiver according to claim 1,
wherein the thermal conductive gel contacts and covers the heat generating component, and is in contact with the second printed circuit board, and
an area of a portion of the thermal conductive gel in contact with the second printed circuit board is larger than an area occupied by the heat generating component on the first printed circuit board.

* * * * *